(12) United States Patent
Wilson et al.

(10) Patent No.: US 9,202,595 B2
(45) Date of Patent: Dec. 1, 2015

(54) POST PACKAGE REPAIR OF MEMORY DEVICES

(71) Applicant: MICRON TECHNOLOGY, INC., Boise, ID (US)

(72) Inventors: Alan J. Wilson, Boise, ID (US); Jeffrey Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 14/077,630

(22) Filed: Nov. 12, 2013

(65) Prior Publication Data

US 2015/0135038 A1    May 14, 2015

(51) Int. Cl.
G06F 11/10    (2006.01)
G11C 29/00    (2006.01)

(52) U.S. Cl.
CPC ........................... G11C 29/76 (2013.01)

(58) Field of Classification Search
CPC .................................................... H04L 1/0009
USPC .................. 714/773, 719, 718, 712, 6.12
See application file for complete search history.

(56) References Cited

U.S. PATENT DOCUMENTS

| | | | |
|---|---|---|---|
| 3,886,323 A * | 5/1975 | Miller et al. ................... | 714/712 |
| 5,278,839 A | 1/1994 | Matsumoto et al. | |
| 5,764,878 A | 6/1998 | Kablanian et al. | |
| 5,910,921 A | 6/1999 | Beffa et al. | |
| 6,085,334 A | 7/2000 | Giles et al. | |
| 6,967,878 B2 | 11/2005 | Dono | |
| 7,020,033 B2 | 3/2006 | Nagata et al. | |
| 7,350,119 B1 | 3/2008 | Zuraski, Jr. et al. | |
| 7,437,626 B2 | 10/2008 | Chang et al. | |
| 7,606,102 B2 | 10/2009 | Blodgett | |
| 7,684,266 B2 | 3/2010 | Lee | |
| 7,746,712 B2 * | 6/2010 | Kang et al. ...................... | 365/201 |
| 7,768,847 B2 * | 8/2010 | Ong et al. ...................... | 365/200 |
| 8,086,916 B2 | 12/2011 | Kopel | |
| 2002/0133769 A1 | 9/2002 | Cowles et al. | |
| 2005/0041491 A1 * | 2/2005 | Kyung ........................... | 365/200 |
| 2005/0097383 A1 | 5/2005 | Puri et al. | |
| 2005/0149782 A1 | 7/2005 | McPartland | |
| 2012/0054549 A1 | 3/2012 | Kwan et al. | |
| 2013/0083612 A1 | 4/2013 | Son et al. | |
| 2013/0223171 A1 | 8/2013 | Kim et al. | |
| 2013/0235644 A1 | 9/2013 | Chung | |

OTHER PUBLICATIONS

Cataldo, Anthony, "Virage Logic Readies self-repairing embedded memory," EE Times, Mar. 6, 2001, 2 pages. Available at: http://www.eetimes.com/document.asp?doc_id=1143164&print=yes (accessed, Apr. 10, 2014).

* cited by examiner

*Primary Examiner* — Fritz Alphonse
(74) *Attorney, Agent, or Firm* — Knobbe, Martens, Olson & Bear, LLP

(57) ABSTRACT

An apparatus for post package repair can include memory cells in a package. A storage element can store information responsive to a post-package repair mode being activated. The information can identify an address mapped to a portion of the memory cells to be repaired. The storage element can store the information responsive to data received from nodes of the package. A walking token circuit can interrogate the information stored in the storage element in a serial fashion responsive to the post-package repair mode being activated. A mapping circuit can remap, responsive to the interrogation, the address to be repaired to another portion of the memory cells.

38 Claims, 7 Drawing Sheets

POST PACKAGE REPAIR OF MEMORY DEVICES

BACKGROUND OF THE INVENTION

1. Field of the Invention

Embodiments of the invention relate to memory devices, and more particularly, to post-packaging repair of memory devices.

2. Description of the Related Art

Memory cells of memory devices such as dynamic random access memories (DRAMs) can experience failures. Failures can occur after the memory device (e.g., a memory chip) has been packaged. After a memory device has been packaged, the memory device can be tested to identify defective memory cells. Addresses mapped (e.g., assigned) to defective memory cells can be remapped (e.g., reassigned) to redundant memory cells so that the memory device can still be effective.

A group of programmable elements can be programmed to store the remapping. One example of a group of programmable elements includes a row of antifuses. An antifuse has a high resistance in its initial state. An antifuse can permanently create an electrically conductive path when a relatively high voltage is applied across the antifuse. An antifuse can have a structure similar to that of a capacitor, i.e., two conductive electrical terminals are separated by a dielectric layer. To create an electrically conductive path, a relatively high voltage is applied across the terminals, breaking down the interposed dielectric layer and forming a conductive link between the antifuse terminals. Creating a conductive path through an antifuse is referred to as "blowing an antifuse."

BRIEF DESCRIPTION OF THE DRAWINGS

The embodiments will be better understood from the Detailed Description of the Embodiments and from the appended drawings, which are meant to illustrate and not to limit the embodiments, and wherein.

DETAILED DESCRIPTION OF EMBODIMENTS

Figure 1:
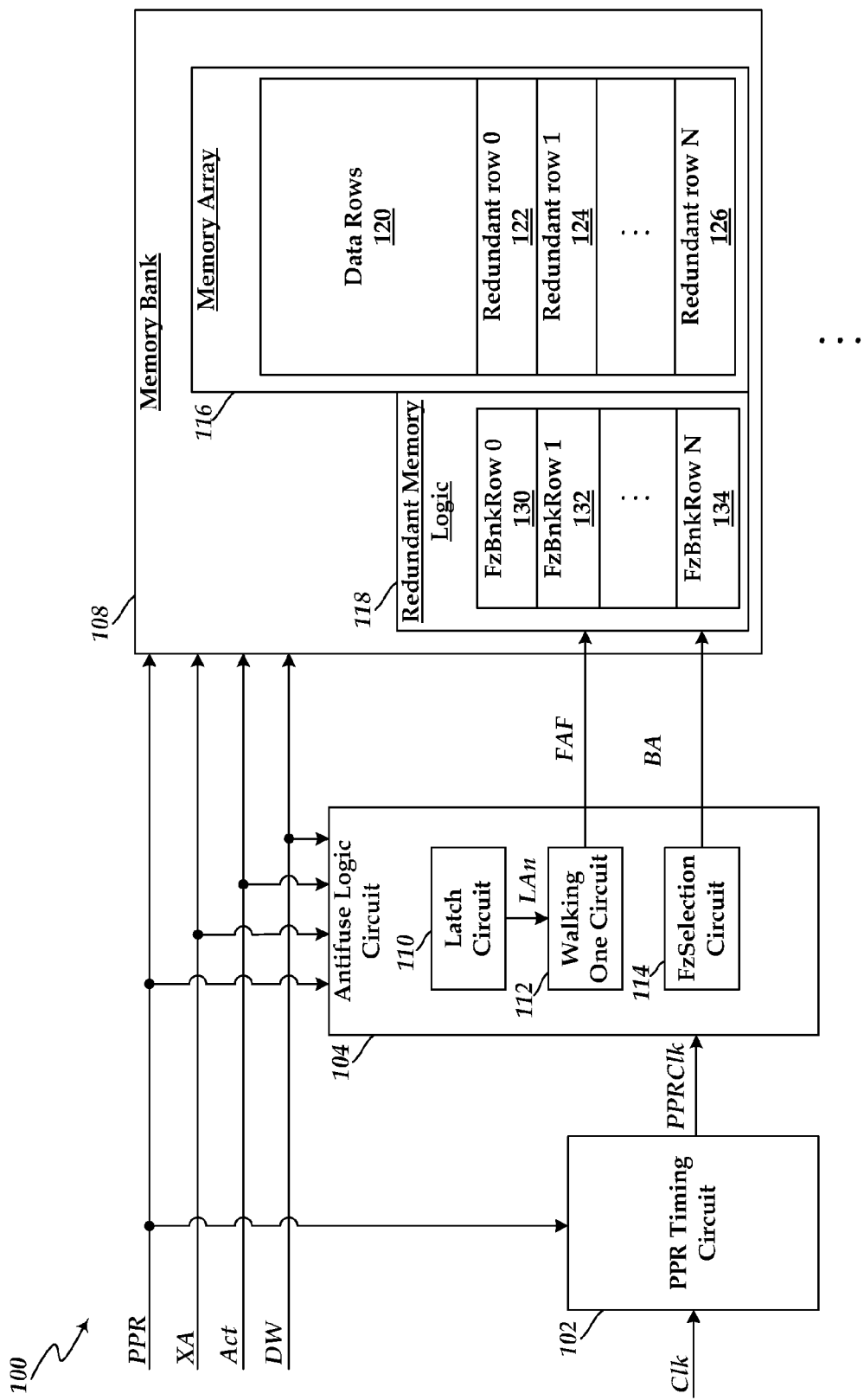
FIG. 1 is a block diagram illustrating one embodiment of a memory device configured to remap memory addresses post packaging.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

After a memory device has been packaged, it is typically accessible only through nodes (e.g., contacts, pins, etc.) of the package, which makes repair of the memory device more difficult than prior to packaging. In addition, some memory errors are detected only after the memory device has been packaged and assembled into a larger unit, such as a dual-inline memory modules (DIMMs). It is desirable to be able to repair memory devices after packaging to improve overall yield and to reduce cost. In one embodiment, a post package repair feature is provided to repair defective memory cells by remapping an address of a defective portion of the memory cells to another portion of the memory cells (where the other portion of the memory cells is often referred to as "redundant memory"). For example, a group of memory cells (e.g., a column or row of memory cells) of the redundant memory is associated with (e.g., corresponds to) a group of programmable elements, such as antifuses. The group of programmable elements can be programmed with the address of a defective portion of the memory cells, post packaging, to remap that address to the associated group of memory cells of the redundant memory.

The post package repair feature can be controlled by a controller that is external to the memory device. For example, the controller can repair a packaged memory device by providing signals to nodes of the packaged memory device. For example, the controller can provide signals on pre-existing Activate, Data Write, Data, and/or like external nodes of a packaged DRAM device.

In an embodiment, the post package repair feature can repair a memory device by reassigning an address that is assigned to a defective portion of the redundant memory. For example, a portion of the redundant memory to which an address has already been remapped could itself become defective post-packaging. In one such embodiment, a group of programmable elements associated with a group of memory cells of the redundant memory can store an enable bit in addition to storing address digits, such as address bits. A particular programmable element can be configured to store an address digit to be used in conjunction with the enable bit to determine whether the associated group of memory cells of the redundant memory is enabled. For example, if the particular programmable element and the enable bit are both in the same state (either both "blown" or both "not blown"), then the associated group of memory cells of the redundant memory is not enabled. Otherwise, if just one of the programmable element or the enable bit is blown, then the associated group of memory cells of the redundant memory is enabled. Accordingly, one embodiment of post package repair determines if the address to be remapped is already assigned to a group of memory cells of the redundant memory. If it is, then the post package repair feature can disable the associated group of memory cells of the redundant memory to which the address to be repaired was assigned by blowing the "unblown" programmable element of the two programmable elements used for determining whether the group of memory cells of the redundant memory is enabled.

In the context of this document, a group of commonly coupled memory cells can correspond to, for example, a "row" of memory cells (which is also sometimes referred to herein as a "row of memory"). The group of commonly coupled memory cells can alternatively correspond to a "column" of memory cells. A programmable element can correspond to, for example, an "antifuse" or a "fuse." It will be appreciated that a programmable element could be any suitable storage or programmable device. Repairing a row of memory can mean, for example, reassigning the address previously assigned to a defective row of memory to another row of memory. "Programming," "enabling," and "disabling" a redundant row can mean, for example, programming, enabling, or disabling antifuses associated with a row of memory cells of the redundant memory. A walking token circuit can be referred to, by example, as a "walking one circuit." It will be appreciated that the walking token circuit could be, for example, a "walking zero circuit." A logic signal name ending with a trailing "F" can denote an active-low signal. However, it will be appreciated that the various embodiments of this document can include alternative active-high and/or active-low logic definitions.

FIG. 1 is a block diagram illustrating one embodiment of a memory device 100 configured to remap memory addresses post packaging. The memory device 100 includes a post package repair (PPR) timing circuit 102, a mapping logic circuit 104 such as an antifuse logic circuit, and a memory bank 108. The mapping logic circuit 104 can include a storage element 110 such as a latch circuit, a walking token circuit 112 such as a walking one circuit, and a selection circuit 114 ("FzSelection"). The memory bank 108 can include a mapping circuit 118 such as redundant memory logic and a memory array 116. The memory array 116 can include rows of primary memory cells 120 (hereinafter "data rows") and N+1 rows of redundant memory cells 122-126 (hereinafter "redundant rows"). Although redundant rows 122-126 are generally illustrated in FIG. 1 as being co-located with data rows 120, in some embodiments they may be physically separate from the data rows 120 (e.g., on different substrates). In some embodiments, the memory device 100 can include other memory banks in addition to the illustrated memory bank 108. The mapping circuit 118 can include N+1 groups of programmable elements, such as N+1 rows ("FzBnkRow 0-N") of antifuses 130-134.

It will be appreciated by one skilled in the art that one or more of elements of the memory device 100, such as the memory array 116, can be included in (e.g., at least partially encapsulated by) any suitable electronic packaging material (either alone or with other memory devices). In some embodiments, one or more of the lines PPR, XA, Act, and DW can correspond to external nodes of the packaging.

In one embodiment, an external circuit (not shown) can provide a signal labeled PPR to control a mode of operation, such as a repair mode, of the memory device 100. For example, in one embodiment the external circuit can be configured to test (e.g., probe) the memory array 116 for defective rows of memory. The external circuit can also assert the PPR signal to command the memory device 100 to operate in a post package repair (PPR) mode for repair of the identified defective rows of memory. The external circuit can provide the signal PPR directly or indirectly. One example of directly providing the signal PPR includes setting a mode register coupled to the memory device 100. The mode register can store values indicating modes of operation—including the PPR mode. One or more of the elements of the memory device 100 can be operatively coupled to the mode register and/or can interpret or decode the value corresponding to the PPR mode.

Additionally or alternatively, the external circuit can provide the memory device 100 additional signals XA, Act, and DW for further control of the memory device 100 during PPR mode operation. For example, during PPR mode, the signal XA ("repair address") can carry an address of the memory array 116 to be repaired (regardless of whether the associated group of memory cells is actually defective). The repair address XA may be mapped to one or more of the data rows 120 or may have been previously remapped to one or more of the redundant rows 122-126. The signals Act and DW during PPR mode can correspond to the "activate" and "data write" nodes, respectively, of a package including the memory device 100. In PPR mode, the signals ACT and/or DW can be used to select the memory bank and/or memory device, for example, if there are a plurality of memory banks 108 and/or devices 100 included in the package.

Additionally, the external circuit can provide timing and synchronization via a clock signal Clk. The clock signal Clk can correspond to a global clock also used, for example, during non-repair operation. One example of the clock signal is a data refresh clock signal of DRAM-type memory devices.

The PPR timing circuit 102 can be configured to receive the signal PPR and the clock signal Clk and to provide (e.g., generate) a repair mode clock signal PPRClk. For example, responsive to (e.g., based at least in part on or at least partially in response to) entering the PPR mode (responsive to the signal PPR), the PPR timing circuit 102 can be configured to generate the PPRClk responsive to the Clk signal to provide a timing signal for the mapping logic circuit 104 and/or the memory bank 108 operating in the repair mode. For example, the mapping circuit 118 can program the rows of antifuse 130-134 at a frequency lower than the frequency of the signal Clk. Accordingly, in one embodiment, the PPR timing circuit 102 is configured to frequency divide the signal Clk to generate the repair mode clock signal PPRClk at a lower frequency than the signal Clk. By generating a repair mode clock signal PPRClk responsive to the frequency of a global clock signal such as the signal Clk, additional clock circuitry, such as additional oscillators, can be omitted, which can reduce the size and/or complexity of some embodiments.

In one embodiment, the PPR timing circuit 102 can be configured to generate two separate timing signals. For example, the repair mode clock signal PPRClk can comprise two signals: PPRClk<0> and PPRClk<1>. The signal PPRClk<0> can provide a timing signal for programming antifuses of the rows of antifuses 130-134. Additionally or alternatively, the signal PPRClk<1> can be used to provide timing of phases of the repair mode, such as a disable phase and a programming phase. The disable phase, for example, will be described in further detail later in connection with FIGS. 5-7. The programming phase, for example, will be described in further detail later in connection with FIGS. 2-4.

The mapping logic circuit 104 can be configured to receive one or more of the signals PPRClk, PPR, XA, Act, and DW signals, and to provide (e.g., generate) an antifuse address signal FAF and a bank address signal BA as outputs. The mapping logic circuit 104 can be an antifuse logic circuit as illustrated in FIG. 1. The antifuse address signal FAF can indicate an address to be repaired by providing the antifuse address signal FAF to a row of antifuses 130-134 selected in accordance with the bank address signal BA. In some embodiments, the antifuse address signal FAF provides the address serially. For example, the antifuse address signal FAF can include a plurality of bits that are asserted or not asserted sequentially over time responsive to the address to be repaired XA.

The storage element 110 of the mapping logic circuit 104 can be configured to store information responsive to activation of the PPR mode. For example, the storage element can correspond to a latch device, a flip-flop device, or any applicable data storage device or state machine. The information can correspond to a latched address LAn of the repair address XA. In one embodiment, the PPR mode is activated responsive to signals applied to nodes of a package including the memory device 100. As illustrated in FIG. 1, the storage element 110 can be a latch circuit.

The walking token circuit 112 of the mapping logic circuit 104 can be configured to interrogate the information stored in the storage element 110 in a serial fashion responsive to the repair mode being activated. Interrogating information can encompass determining value(s) of the information. For example, the walking token circuit 112 can be configured to receive the signal PPR and the latched address LAn from the storage element 110. The walking token circuit 112 can interrogate (e.g., test) the latched address LAn responsive to a sequence of bitwise comparisons between the latched address LAn and a plurality of bits An (also referred herein as an "interrogation signal"). The plurality of bits An can include an active bit. The walking token circuit 112 can be configured to shift the active bit through each of the plurality of bits An, one at a time, over the course of the sequence of comparisons. Accordingly, the bits of the latched address LAn can be tested one at a time. In the embodiment illustrated in FIG. 1, the walking token circuit 112 is a walking one circuit in which the active bit has a logic "1" value. It will be appreciated by one skilled in the art that any suitable state can be shifted through the plurality of bits An. For example, in alternative embodiments, the walking token circuit 112 can be implemented as a walking zero circuit that sequentially shifts (e.g., propagates) a logic "0" through each bit of its output An.

The selection circuit 114 of the mapping logic circuit 104 can be configured to provide (e.g., generate) the bank address signal BA. The bank address signal BA indicates the row of the rows of antifuses 130-134 selected to be programmed in accordance with the antifuse address signal FAF. In one embodiment, the selection circuit 114 can correspond to a counter circuit configured to increment the row selection responsive to the signal PPR. It will be appreciated by one skilled in the art that any suitable selection scheme can be utilized.

The memory array 116 of the memory bank 108 can comprise memory cells arranged in groups of commonly coupled memory cells, such as addressable rows and/or columns. The data rows 120 can correspond to rows of memory cells originally (e.g., prior to testing) assigned to addresses for data storage. The memory bank 108 also includes the N+1 redundant rows 122-126 that serve to selectively store data responsive to remapping an address associated with a defective row of the memory array 116. The memory array 116 can correspond to any applicable data storage device, such as one or more types of random access memory such as DRAM, SDRAM, SRAM, and/or the like data storage devices.

The mapping circuit 118 of the memory bank 108 can be configured to receive the antifuse address signal FAF and the bank address signal BA as inputs, and can be configured to remap the repair address XA to a selected redundant row 122-126. For example, each of the N+1 rows of the antifuses 130-134 is associated with (e.g., corresponds to) a respective one of the redundant rows 122-126 of the memory array 116. The rows of antifuses 130-134 serve to store addresses remapped to respective redundant rows 122-126. Accordingly, the repair address XA can be reassigned to a redundant row by programming the repair address XA into a selected row of the rows of antifuses 130-134. The selection of the row of antifuses can be responsive to the bank address BA. The mapping circuit 118 can be a redundant memory logic circuit, for example, as illustrated in FIG. 1.

Figure 2:
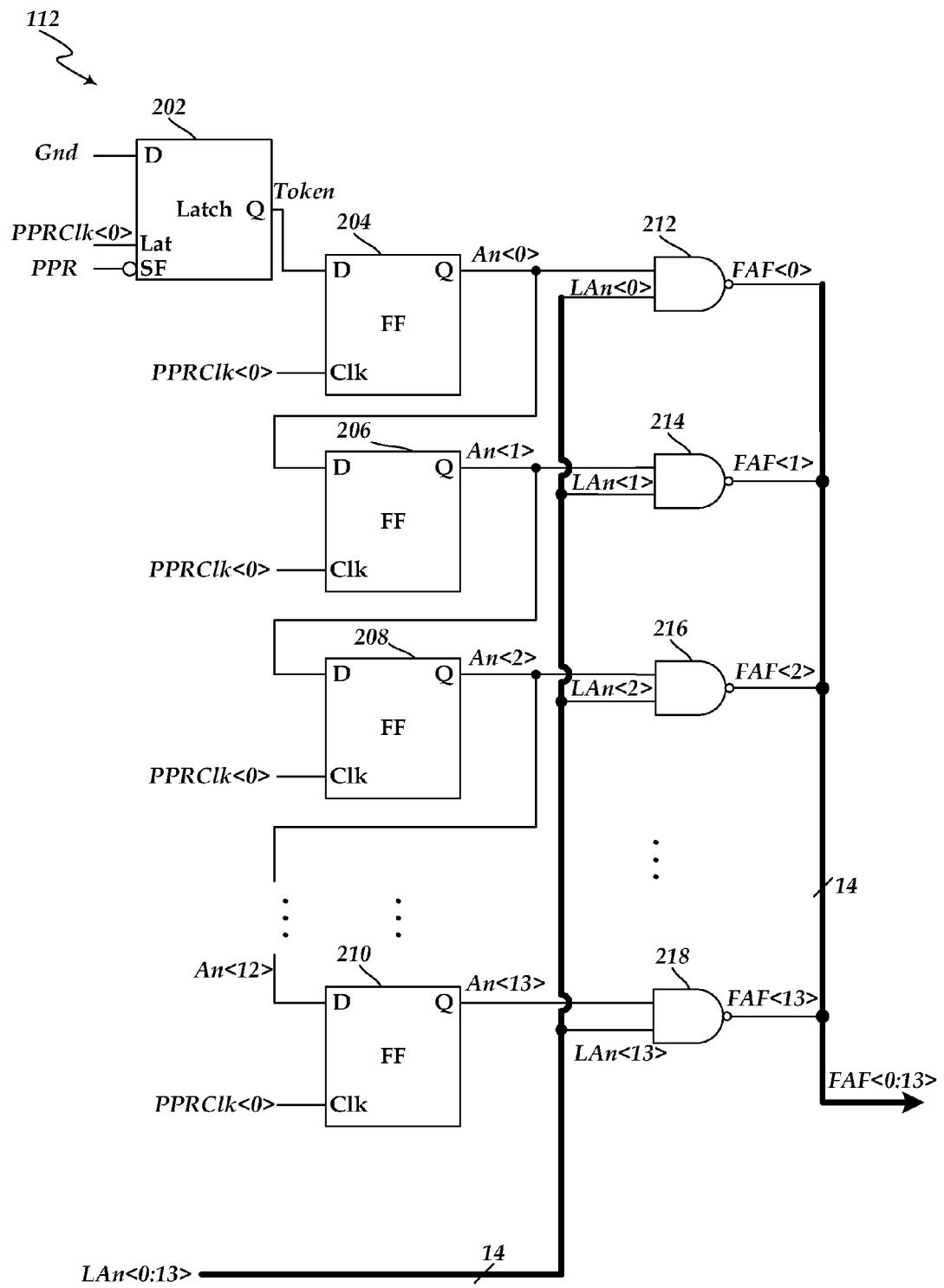
FIG. 2 is a block diagram illustrating one embodiment of a walking one circuit for the memory device of FIG. 1.

FIG. 2 is a block diagram illustrating one embodiment of a walking one circuit 112 of the memory device 100 of FIG. 1. The walking one circuit 112 can include a latch 202, a plurality of flip-flops 204-210 connected in series to one another, and NAND gates 212, 214, 216, 218.

The latch 202 can be configured to receive a ground signal Gnd for logic zero, a clock signal such as PPRClk<0>, and a repair mode signal PPR as inputs and configured to generate a signal Token as an output. The latch 202 of the illustrated walking token circuit 112 can be configured to assert the signal Token low responsive to the clock signal PPRClk<0> and the signal PPR being asserted. If the signal PPR is asserted low to the input of the active low set false (SF) input, the stored value of the latch 202 is set to a "1." Accordingly, during non-repair operation, the latch 202 can be configured to store and output "1" and, during the start of the repair mode, to assert the Token low. Accordingly, the signal Token, when asserted low, can provide an indication that the mapping logic circuit 104 is operating in the repair mode (e.g., a programming phase of the repair mode).

The plurality of flip-flops 204-210 can be operatively coupled to one another in series from input to output. For example, the flip flop 204 can be configured to receive the signal Token as an input and to generate a bit An<0> as an output. When in a non-repair mode, the latch 202 can provide the Token signal at a logic "1" value to the input of the flip-flop 204. As such, the flip-flop 204 can output a logic "1" signal responsive to activation of the repair mode. The latch 202 can then provide the Token signal at a logic "0" to the input of the flip-flop 204 after activation of the repair mode so that the flip-flop 204 can then output a logic "0". The output An<0> of the flip flop 204 is provided to the subsequent flip flop 206 in the sequence, and the flip flop 206 can be configured to generate a bit An<1> as an output. The output An<1> of the flip flop 206 is provided to the subsequent flip flop 208, and the flip flop 208 can be configured to generate a bit An<2> as an output. The series-connection pattern continues to the last flip flop 210, which can be configured to receive a bit An<12> as an input from a previous flip flop (not shown) in the sequence, and is configured to generate a fourteenth bit An<13> as an output. Additionally, the flip flops 204-210 can each be configured to receive the clock signal PPRClk<0> to control the timing of the flip flops 204-210. In operation, each of the flip flops 204-210 can be configured to store the value provided by the preceding flip flop (or latch, in the case of the flip flop 204) at each clock cycle (for example, responsive to the rising edges of the clock signal PPRClk<0>) during the repair mode. The operation of the latch 202 and the flip flops 204-210 of the walking one circuit 112 will be described in further detail later in connection with FIG. 3.

The NAND gates 212, 214, 216, 218 can be configured to receive the plurality of bits An<0:13> and the latched address LAn<0:13> as inputs and configured to generate the antifuse address FAF<0:13> as an output. For example, each of the NAND gates 212, 214, 216, 218 can be configured to generate a respective bit of the antifuse address FAF<0:13> by performing a (bitwise) NAND logic operation on a respective bit of the latched address LAn<0:13> and a respective bit of the interrogation signal An<0:13>. The operation of the NAND gates 212, 214, 216, 218 of the walking one circuit 112 will be described in further detail later in connection with FIG. 3.

Figure 3:
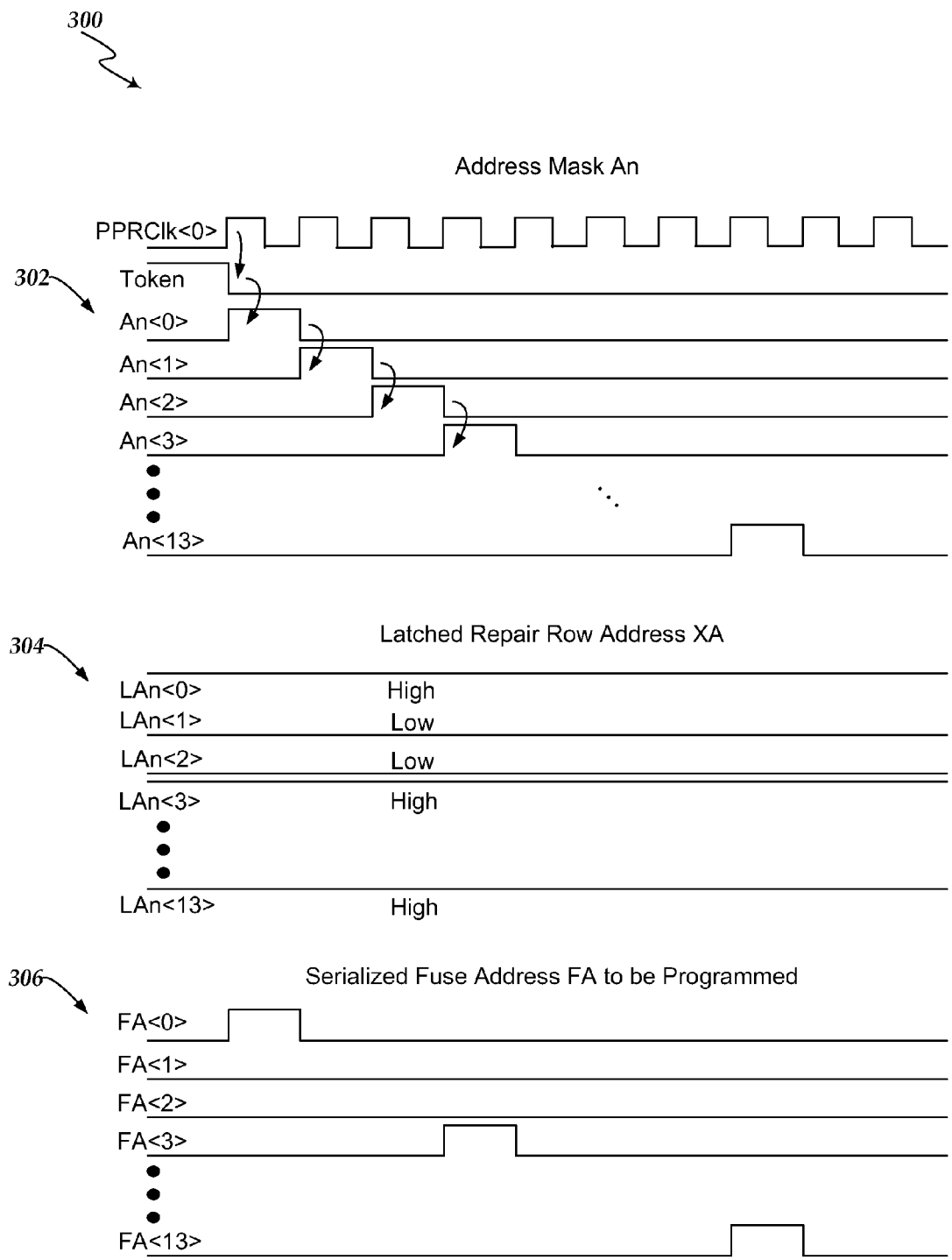
FIG. 3 is a timing diagram of the embodiment of the walking one circuit of FIG. 2.

FIG. 3 is a timing diagram 300 of the embodiment of the walking one circuit 112 of FIG. 2. The timing diagram includes an example plot 302 of the interrogation signal An, an example plot 304 of the latched address LAn, and an example plot 306 of the fuse address FA. In each plot, the horizontal axis represents time, and the vertical axis represents the corresponding signal values.

The plot 302 illustrates an example of the interrogation signal An (for example, the outputs of the flip flops 204-210 of FIG. 2) of a walking one circuit during repair mode operation. The walking one circuit can correspond to the walking one circuit 112 of FIG. 2. The walking one circuit can be configured to shift a "1" value of the interrogation signal An at each clock cycle of PPRClk<0> during a programming phase of the repair mode. For example, initially each of the bits of the interrogation signal An can provide a "0" value. Responsive to a rising edge of the clock signal PPRClk<0> of the PPR mode, the bit An<0> can be set to the previous value (for example, to the value just prior to the rising edge of PPRClk) of the Token. As shown in FIG. 3, the previous value of the signal Token is a "1." Accordingly, the interrogation bit An<0> can provide a "1" during the first clock cycle of the repair mode, and the remaining bits of An can provide the "0" of the preceding bits. At the next clock cycle, the "1" bit is shifted (e.g., "passed") to the interrogation bit An<1>, and the remaining bits of An can provide the "0" of the preceding bits or the Token. The operation is repeated for a plurality of clock cycles and the "1" bit is shifted to each of the bits of the interrogation signal An over the course of a plurality of clock cycles of the repair mode.

The plot 304 illustrates an example of the latched address LAn (for example, provided by the output LAn of the storage element 110 of FIG. 1). The bits of the latched address LAn are set as a "0" or a "1" responsive to the address of the defective row. The address of the defective row can be provided as the repair address XA. The bits of the latched address LAn remain approximately constant over the illustrated period of the repair operation of FIG. 3.

The plot 306 illustrates an example of a fuse address signal FA (for example, corresponding to the complement of the output FAF of the NAND gates 212, 214, 216, 218 of FIG. 2). The bits of the fuse address signal FA are set to the values of the bits of the latched address LAn sequentially responsive to the position of the "1" of the interrogation signal An. Accordingly, in one embodiment, the fuse address signal FA can advantageously have at most one bit set active at each clock cycle, which reduces the demands on charge pump circuits used to generate a supply voltage Vpop used to blow the antifuses. As described below in greater detail in connection with FIG. 4, some embodiments of the memory device blow the antifuses of selected rows of antifuses (for example, selected rows of rows 130-134 of FIG. 1) responsive to the fuse address FA (or FAF). Accordingly, antifuses can advantageously be blown sequentially to program addresses into selected rows of antifuses.

Figure 4:
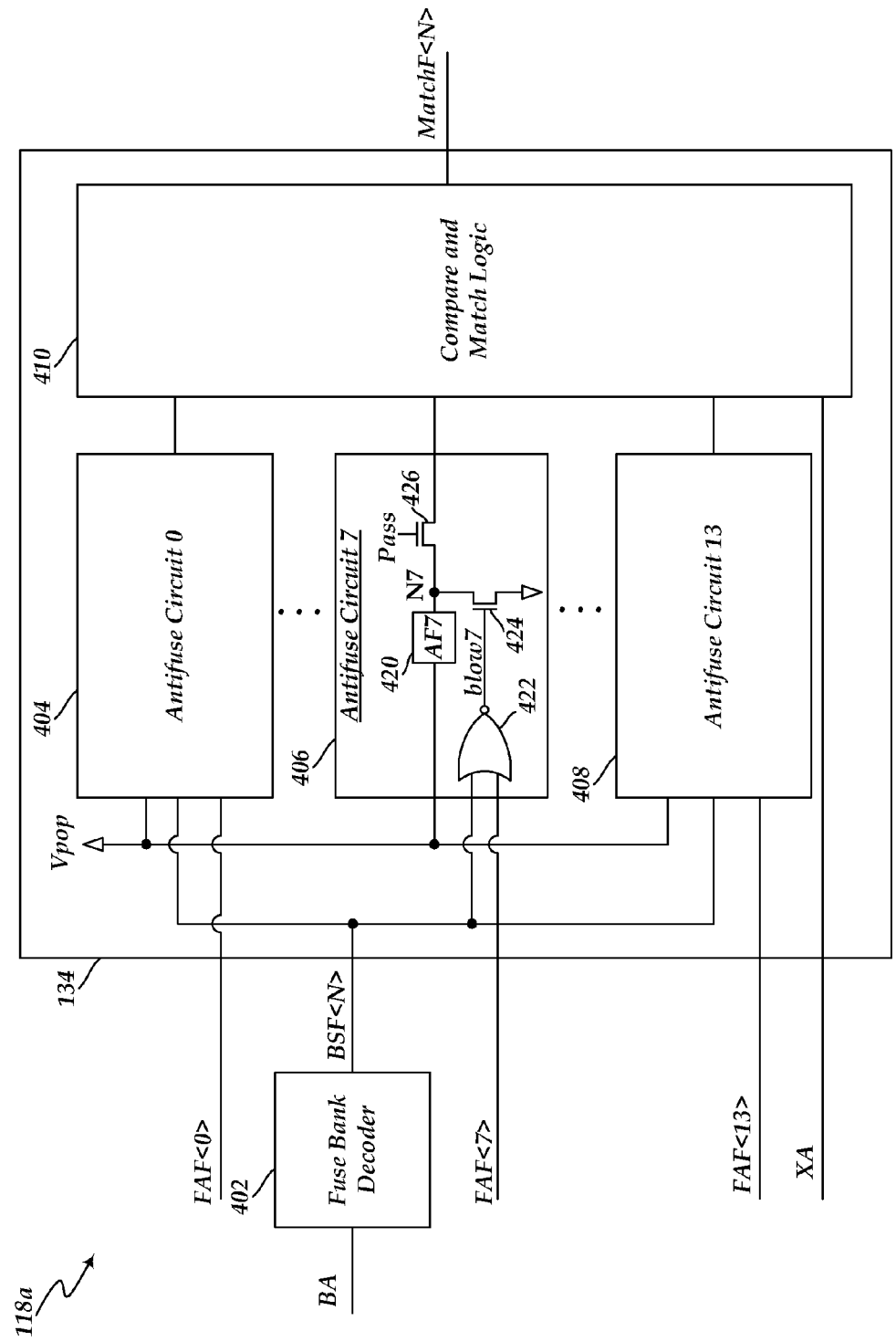
FIG. 4 is a schematic block diagram of one embodiment of a mapping logic circuit of the memory device of FIG. 1.

FIG. 4 is a schematic block diagram of one embodiment of a mapping circuit 118a of the memory device 100 of FIG. 1. The mapping circuit 118a includes a fuse bank decoder 402 and N+1 rows of antifuses (only row 134 is shown for the sake of clarity). The row of antifuses 134 includes n antifuse circuits, such as the 14 antifuse circuits 404-408 of the illustrated embodiment, and a compare and match logic 410 ("compare logic 410"). Each antifuse circuit 404-408 includes an antifuse (for example, antifuse 420), a NOR gate (for example, NOR gate 422), a blow switch (for example, blow switch 424), and a pass switch (for example, pass switch 426).

The fuse bank decoder 402 can be configured to receive the bank address BA as an input, and can be configured to provide the decoded selection bit BSF<N> as an output. The fuse bank decoder 402 can be configured to provide N+1 bank selection bits BSF<0:N>, one for each of row of antifuses. The fuse bank decoder 402 can be configured to assert the particular decoded selection bit of the signal BSF<0:N> if the bank address BA indicates to select the corresponding row of antifuses of the memory bank.

The illustrated row of antifuses 134 includes 14 antifuse circuits 404-408 as an example. Other embodiments can have any suitable number of antifuse circuits. Each of the antifuse circuits 404-408 can be configured to receive a voltage supply Vpop, the decoded selection signal BSF<N>, and a corresponding bit of the antifuse address signal FAF<0:13> as inputs, and is operatively coupled to the compare logic 410. For example, the antifuse circuit 404 can be configured to receive bit FAF<0>. The antifuse circuits 404-408 are each configured to blow a respective antifuse with the voltage supply Vpop responsive to the decoded selection signal BSF<N> and the corresponding bit of the antifuse address signal FAF.

The antifuse 420 of the antifuse circuit 406 has a first end operatively coupled to the voltage supply Vpop and a second end operatively coupled to the node N7. The antifuse 420 can be configured to blow when the voltage difference across the first and second ends is sufficiently large. For example, the antifuse 420 can be configured to blow when the first end is operatively coupled to the voltage supply Vpop and the second end is operatively coupled to ground. If the antifuse 420 is blown, the voltage supply Vpop can be coupled to the node N7.

The NOR gate 422 of the antifuse circuit 406 can be configured to receive the decoded selection signal BSF<N> and the bit FAF<7> of the fuse address signal FAF as inputs, and configured to generate the signal blow7. The NOR gate 422 can be configured to control the blow switch 424 responsive to a NOR logic operation on the decoded selection signal BSF<N> and the fuse address bit FA<7>. Accordingly, if the decoded selection signal BSF<N> and the fuse address signal FA<7> are asserted low, the illustrated NOR gate 422 is configured to assert the signal blow7 high and to thereby close the blow switch 424.

The blow switch 424 of the antifuse circuit 406 has a gate to receive the signal blow7, a drain operatively coupled to node N7, and a source operatively coupled to ground. The blow switch 424 can be configured to selectively connect node N7 to ground responsive to the signal blow7. Accordingly, if the blow switch 424 is closed, the antifuse 420 can be configured to blow since the node N7 is pulled down to ground, thereby creating a large voltage potential across the first and second ends of the antifuse 420. The blow switch 424 can correspond to an N-type MOS transistor. It will be appreciated, however, that any applicable type of transistor can be selected. It will also be appreciated that the source and the drain can be swapped.

The pass switch 426 of the antifuse circuit 406 has a gate to receive a pass signal (for example, generated by an external circuit or by a controller (not shown) of the mapping circuit 118 of FIG. 1), a source operatively coupled to the node N7, and a drain operatively coupled to the compare logic 410. The pass switch 426 can be configured to selectively couple the node N7 to the compare logic 410 responsive to the pass signal. During the blowing antifuse process, the pass switch 426 can be configured to open and isolate the antifuse-blowing process from the compare logic 410. During operation in which the row of antifuses 134 is read, the pass switch 426 can be configured to close. The pass switch 426 can correspond to an N-type MOS transistor. It will be appreciated, however, that any applicable type of transistor can be selected. It will also be appreciated that the source and the drain can be swapped.

The compare logic 410 can be operatively coupled to each of the antifuse circuits of each row of antifuses. In normal (non-PPR mode) operation, the compare logic 410 can also be configured to receive an address to be accessed XA as an input and to generate a match signal MatchF<0:N> as an output. The compare logic 410 can be configured to compare the address to be accessed XA to each address programmed into the rows of antifuses. If the address to be accessed XA matches an address programmed into a row of antifuses, the compare logic 410 can be configured to assert the corresponding bit of the match signal MatchF<0:N> to indicate that the address to be accessed XA has been remapped to a redundant row. Accordingly, in normal operation, the match signal MatchF<0:N> can provide an indication to disable a data row originally associated with the address to be accessed XA, and an indication to instead access the redundant row associated with the row of antifuses programmed with the matching address.

Under some circumstances, after a redundant row has been mapped to an address to repair a defective data row, that redundant row can later be deemed as defective itself. However, programming antifuses can be permanent. Accordingly, there is a need to effectively and efficiently repair redundant rows. For example, there is a need for a way to disable a defective redundant row so that the compare logic 410 does not indicate that the defective redundant row is mapped to the address.

Figure 5:
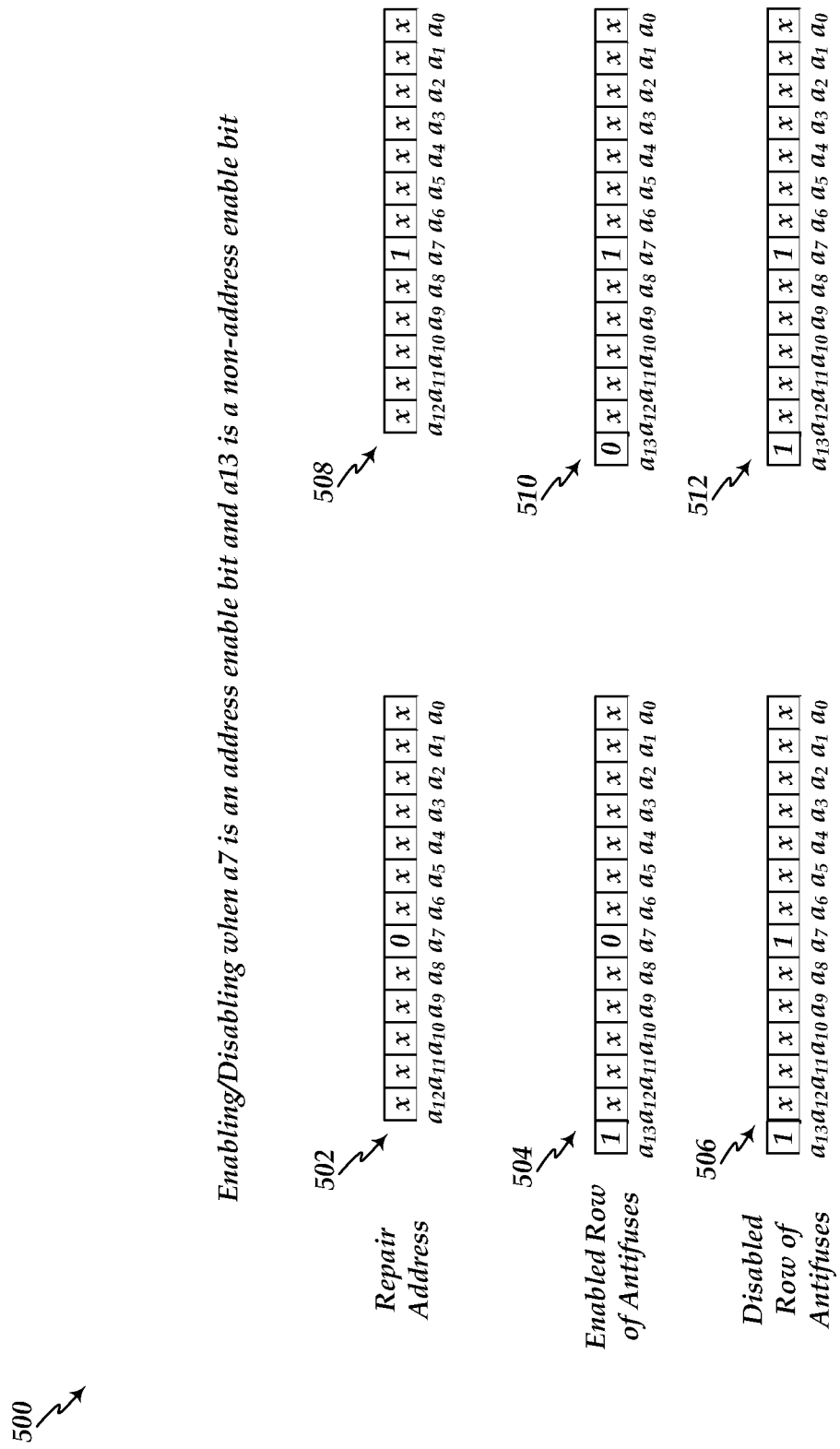
FIG. 5 is a diagram of one embodiment of an enable-disable redundant row scheme.

FIG. 5 is a diagram of one embodiment of an enable-disable redundant row scheme 500. FIG. 5 includes a first example repair address 502, an example of an enabled row of antifuses 504 programmed with the address 502, and an example of a disabled row of antifuses 506 programmed with the address 502. FIG. 5 further includes a second example address 508, an example of an enabled row of antifuses 510 programmed with the address 508, and an example of a disabled row of antifuses 512 programmed with the address 508.

The repair address 502 can correspond to 13 bits of an address to be repaired. The bits labeled with an "x" indicate that the bit can be either high or low. Bit seven of the address 502 of FIG. 5 is a "0." In other embodiments, the repair address can have more or less bits.

The enabled row of antifuses 504 corresponds to n bits (for example, 14 bits) programmed with the address 502 and programmed in the enabled state. Each bit can correspond to an antifuse. For example, bits 13 and 7 of the row 504 of the illustrated embodiment can act in combination to indicate that row 504 is enabled. Bit 7 of the row 504 can be referred to as "an address enable bit" because the address stored by the row 504 can include bit 7 of row 504. For example, bit 7 of the illustrated row 504 stores bit 7 of the address 502. Bit 13 of row 504 can be referred to as "a non-address enable bit" because the address stored by the row 504 can be independent of bit 13 of row 504. While bit 13 of row 504 does not include a bit of the address 502, bit 13 of row 504 can be used to determine whether the row 504 is enabled. For example, if bits 7 and 13 of row 504 have different values, then the row 504 (and the corresponding redundant row) is enabled (e.g., activated). Otherwise, the row 504 is disabled (e.g., inactive). Accordingly, when the address 502 is programmed into the row 504, bit 13 of row 504 can be programmed to a state different from bit 7 of the address 502 to enable the row 504, as shown in FIG. 5.

The disabled row of antifuses 506 corresponds to n bits (for example, 14 bits) programmed with the address 502 and programmed in the disabled state. Each bit can correspond to an antifuse. As a non-limiting example, the row 506 can be disabled to repair the redundant row corresponding to row 506. In one embodiment, the row 506 can be disabled by programming the address enable bit and the non-address bit to the same state. For example, bits 7 and 13 of row 506 are each programmed to a "1," thereby disabling the redundant row corresponding to the row 506.

In the second example, the repair address 508 includes a "1" instead of a "0" at the address enable bit (for example, bit 7) of the address 508. Row 510 corresponds to the enabled state of a row of antifuses programmed with the address 508. For example, the non-address enable bit (for example, bit 13) is in a state different from the address enable bit. Row 512 corresponds to the disabled state of the row of antifuses programmed with the address 508. For example, the non-address enable bit is in the same state as the address enable bit.

During operation, whether a row of antifuse is enabled can be determined responsive to performing an XOR logic operation on the address enable bit and the non-address enable bit.

Accordingly, during operation an enabled row (for example, row 504 or row 510) can be disabled by testing the address enable bit of the address to be repaired. If the address enable bit of the address to be repaired is a "1" then the non-address enable bit can be blown to disable the row. If the address enable bit of the address to be repaired is a "0" then the address enable bit can be blown to disable the row.

In another embodiment, the row of antifuses can comprise an enable bit and a separate disable bit. For example, the enable and disable bits can be dedicated enable and disable bits, respectively, and can both be non-address bits. In operation, responsive to programming a row, the enable bit of the row can be set high and the disable bit of the row can be left low. In addition, to disable the row, the disable bit can be set high (for example, regardless of the state of the enable bit).

Figure 6:
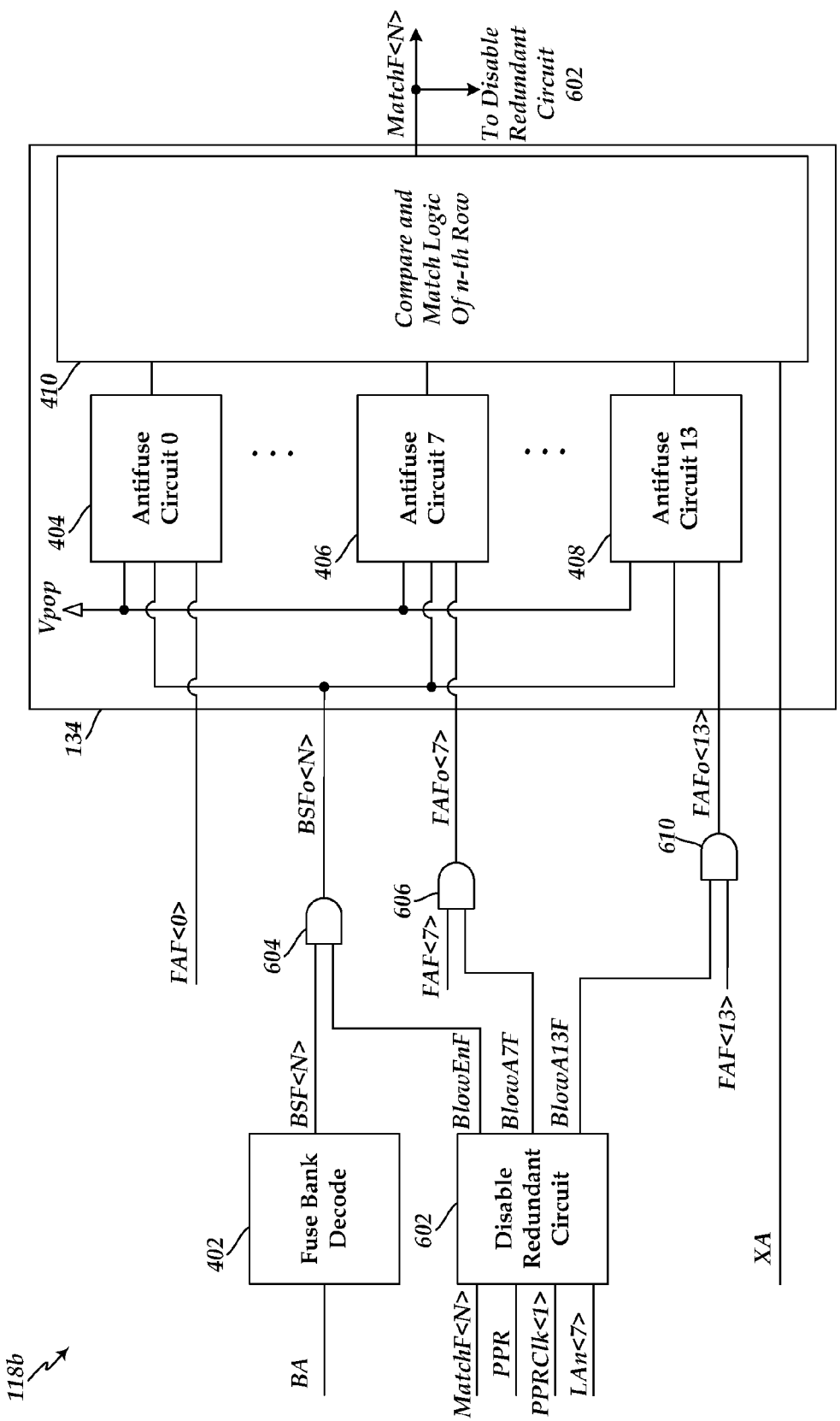
FIG. 6 is a schematic block diagram of another embodiment of a mapping logic circuit of the memory device of FIG. 1.

FIG. 6 is a schematic block diagram of another embodiment of mapping circuit 118*b* of the memory device 100 of FIG. 1. Elements of FIG. 6 common to FIG. 4 share common reference indicia, and only differences between FIGS. 4 and 6 are described herein for the sake of brevity. In view of FIG. 4, the mapping circuit 118*b* of FIG. 6 further includes a disable redundant circuit 602 as well as AND gates 604, 606, 610.

The disable redundant circuit 602 can be configured to receive the MatchF signal, the signal PPR, a clock signal (for example, PPRClk<1>), and an address enable bit of the repair address XA (for example, a bit of the latched address LAn<7>) as inputs, and can be configured to provide a signal blowEnF, a signal BlowA7F, and a signal BlowA13F as outputs. The signal BlowEnF can provide an indication to blow at least one of the enable bits of a selected row of antifuses that had previously been programmed with the repair address XA. The BlowA7F signal can provide an indication to blow the address enable bit (such as, but is not limited to, bit 7) of the selected row of antifuses previously programmed with the repair address XA. The BlowA13F signal can provide an indication to blow the non-address enable bit (such as, but is not limited to, bit 13) of the selected row of antifuses previously programmed with the repair address XA. Accordingly, the disable redundant circuit 602 can be configured to disable a redundant row for repair (e.g., by disabling the redundant row and freeing the address to be programmed to a different redundant row).

In one embodiment, the clock PPRClk<1> can be asserted for a duration before the mapping circuit 118*b* programs the repair address XA in a selected row of antifuses. Accordingly, the clock PPRClk<1> can trigger the disable phase of the PPR mode before the programming phase. During the disable phase, the disable redundant circuit 602 can be configured to disable a defective redundant row (if any). It will be appreciated by one skilled in the art that other embodiments can assert the clock PPRClk<1> for any suitable duration(s) relative to programming the repair address into a second row of antifuses, including for example before, concurrently, and/or after the clock PPRClk<0> is asserted to signal the programming phase.

In operation in the disable phase, the disable redundant circuit 602 can assert the signal BlowEnF based at least on the signal MatchF. As stated, the signal BlowEnF can provide an indication to disable a first redundant row by blowing at least one enable bit so that both enable bits are blown. To determine whether a redundant row is to be disabled, the disable redundant circuit 602 can be configured to test whether the compare logic 410 has asserted a bit of the MatchF signal responsive to a provided repair address XA. For example, the compare logic 410 can be configured to assert a bit of MatchF to indicate that a repair address XA matches an address currently programmed in one of the rows of antifuses.

Additionally, the disable redundant circuit 602 can assert the signal BlowA7F or the signal BlowA13F based at least on the MatchF signal and the address enable bit XA<7> bit of the repair address XA. For example, operating in the disable phase of the PPR mode, the disable redundant circuit 602 can be configured to assert the signal BlowA7F to blow bit 7 (for example, antifuse circuit 406), which can correspond to the address enable bit of the redundant row, if the signal MatchF is asserted and the bit XA<7> is low. Accordingly, blowing the address enable bit can disable the redundant row. Additionally, operating in the disable phase of the PPR mode, the disable redundant circuit 602 can assert the BlowA13F to blow bit 13 (for example, antifuse circuit 408), which can correspond to the non-address enable bit of the redundant row, if MatchF is asserted and the bit XA<7> of the repair address XA is high.

The AND gate 604 can be configured to receive the bank select signal BSF<N> and the signal BlowEnF as inputs, and configured to generate the signal BSFo<N> as an output. For example, the AND gate can be configured to perform an AND logical operation on the bank select signal BSF<N> and the signal BlowEnF to generate the signal BSFo<N>. Accordingly, the signal BSFo<N> can be asserted low if either or both of the bank select signal BSF<N> and the signal BlowEnF are asserted low.

The AND gate 606 can be configured to receive the antifuse address FAF<7> and the signal BlowA7F as inputs and to generate the signal FAFo<7> as an output. For example, the AND gate can be configured to perform an AND logical operation on the antifuse address FAF<7> and the signal BlowA7F to generate the signal FAFo<7>. Accordingly, the signal FAFo<7> can be asserted low if either or both of the antifuse address FAF<7> and the signal BlowA7F are asserted low.

The AND gate 610 can be configured to receive the antifuse address FAF<13> and the signal BlowA13F as inputs and to generate the signal FAFo<13> as an output. For example, the AND gate can be configured to perform an AND logical operation on the antifuse address FAF<13> and the signal BlowA13F to generate the signal FAFo<13>. Accordingly, the signal FAFo<13> can be asserted low if either or both of the antifuse address FAF<13> and the signal BlowA13F are asserted low.

As stated earlier, each of the antifuse circuits 404-408 can be configured to blow an antifuse if both of its inputs (for example, BSFo<N> and FAFo<7> of antifuse circuit 406) are asserted low.

Figure 7:
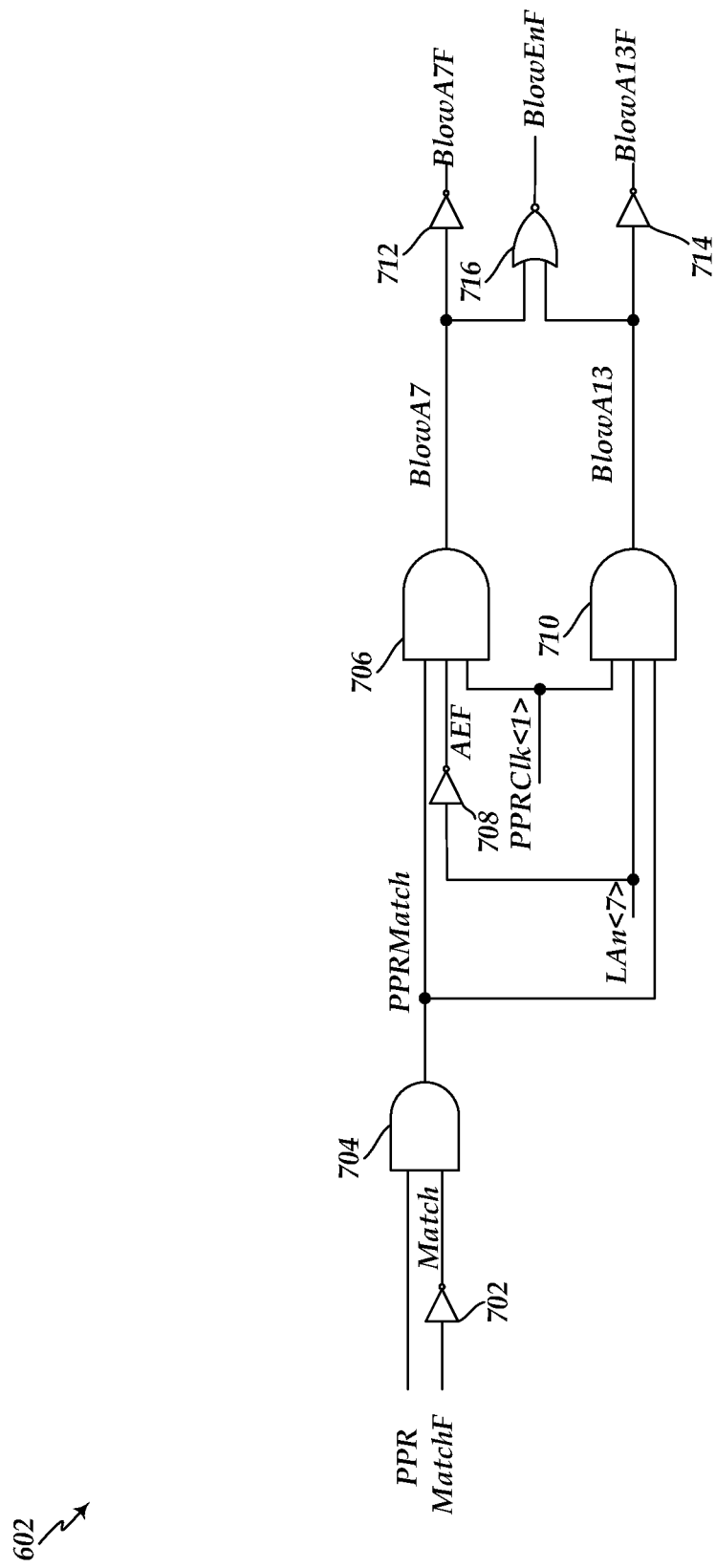
FIG. 7 is a schematic circuit diagram of one embodiment of a disable redundant circuit of the mapping logic circuit of FIG. 6.

FIG. 7 is a schematic circuit diagram of one embodiment of a disable redundant circuit 602 of the antifuse logic circuit 118b of FIG. 6. The disable redundant circuit 602 includes an inverter 702, AND gates 704, 706, an inverter 708, an AND gate 710, inverter 712, 714, and a NOR gate 716. Although the disable redundant circuit 602 illustrated in FIG. 7 uses a portion of the latched address LAn from the storage element 110 in determining which fuse to blow to disable a redundant portion of memory cells, in other embodiments the disable redundant circuit can use any other suitable signal in place of a portion of the latched address LAn, such as a portion of the interrogation signal An.

The inverter 702 is configured to receive the signal MatchF as an input and to generate a signal Match as an output. For example, the inverter 702 can be configured to perform a logical negation operation to generate the signal Match as the complement of MatchF.

The AND gate 704 can be configured to receive the signal PPR and the signal Match as inputs and to generate the signal PPRMatch as an output. For example, the AND gate can be configured to perform an AND logical operation on the signals PPR and Match to generate the signal PPRMatch. Accordingly, the signal PPRMatch can be indicative of activation of the PPR mode and the detection of a redundant row programmed with an address that matches the repair address. Accordingly, the signal PPRMatch can indicate a detection of a redundant row to be disabled to repair the repair address.

The AND gate 706 can be configured to receive the signal PPRMatch, a clock signal (for example, PPRClk<1>), and a complementary address enable signal AEF as inputs and to generate a signal BlowA7 as an output. For example, the AND gate 706 can be configured to perform an AND logical operation on PPRMatch, AEF, and PPRClk<1> to generate BlowA7. Accordingly, the signal BlowA7 can be asserted during a disable phase of the PPR mode when there is a redundant row that matches the latched address LAn and bit LAn<7> is not asserted (indicating, for example, bit 7 of the corresponding row of antifuses has not been blown and bit 13 of the row of antifuses has been blown). Accordingly, asserting signal BlowA7 can indicate to blow antifuse 7 for disabling the redundant row currently mapped to the repair address.

The inverter 708 can be configured to receive the address enable bit LAn<7> of the latched address LAn as an input and to generate the complementary address enable signal AEF as an output. For example, the inverter 708 can be configured to perform a logical negation operation to the address enable bit LAn<7> to generate the complementary address enable signal AEF.

The AND gate 710 can be configured to receive the PPRMatch signal, the clock signal (for example, PPRClk<1>), and an address enable bit of the latched address LAn (for example, LAn<7>) as inputs, and to generate a signal BlowA13 as an output. For example, the AND gate 710 can be configured to perform an AND logical operation on PPRMatch, LAn<7>, and PPRClk<1> to generate BlowA13. Accordingly, the signal BlowA13 can be asserted during the disable phase of the PPR mode when there is a redundant row that matches the repair address XA and bit LAn<7> is asserted (indicating, for example, bit 7 of the row of corresponding antifuses has been blown and bit 13 of the row of antifuses has not been blown). Accordingly, asserting BlowA13 can indicate to blow antifuse 13 to disable the redundant row currently mapped to the repair address.

The inverter 712 can be configured to receive the signal BlowA7 as an input and to generate a complementary signal BlowA7F as an output. For example, the inverter 712 can be configured to perform a logical negation operation on the signal BlowA7 to generate the complementary signal BlowA7F.

The inverter 714 can be configured to receive the signal BlowA13 as an input and to generate a complementary signal BlowA13F as an output. For example, the inverter 714 can be configured to perform a logical negation operation on the signal BlowA13 to generate the complementary signal BlowA13F.

The NOR gate 716 can be configured to receive the signals BlowA7 and BlowA13 as inputs, and to generate a signal BlowEnF as an output. For example, the NOR gate 716 can be configured to perform a NOR logical operation on the signals BlowA7 and BlowA13 to generate BlowEnF. Accordingly, the signal BlowEnF can be asserted during the disable phase of the PPR mode if there is a redundant row that matches the repair address XA. Accordingly, asserting the signal BlowEnF indicates to blow at least one of the enable bits of the redundant row that is currently programmed with the repair address in order to disable the redundant row.

A memory device according to one or more embodiments of this disclosure can save circuit space and logic for repairing memory. In addition, the sequential scheme of some embodiments can be effective for improving programming speed and decreasing chip area.

The principles and advantages described above can apply to various electronic devices including semiconductor devices or components. Examples of the electronic devices can include, but are not limited to, consumer electronic products, electronic circuits, electronic circuit components, parts of the consumer electronic products, electronic test equipments, etc. Examples of the electronic devices can also include memory chips, memory modules such as dual-inline memory modules (DIMMs), receiver circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

One embodiment is an apparatus. As used herein, an apparatus can refer to, for example, circuitry, a die, a device, a package, a module, a card, a system, or the like (or components of any or all of the above). One such apparatus comprises a memory array memory cells in a package, a storage element, a walking token circuit, and a mapping circuit. The storage element can store information responsive to a post-package repair mode being activated. The information can identify an address mapped to a portion of the memory cells to be repaired. The storage element can store the information responsive to data received from nodes of the package. The walking token circuit can interrogate the information stored in the storage element in a serial fashion responsive to the post-package repair mode being activated. The mapping circuit can remap, responsive to the interrogation, the address to be repaired to another portion of the memory cells.

Another embodiment is a method of post-package repair of memory cells. The method comprises activating a post-package repair mode responsive to inputs received from outside of a package including memory cells. The method comprises storing information in a storage element responsive to the post-package repair mode being activated. The information can identifying an address mapped to a portion of the memory cells to be repaired. The storage element can store the information responsive to data received from nodes of the package. The method comprises interrogating the information stored in the storage element in a serial fashion responsive to activation of the post-package repair mode. The method also comprises remapping, responsive to the interrogation, the address to be repaired to another portion of the memory cells.

Another embodiment is a packaged memory device. The packaged memory device comprises memory cells in a package, a mapping logic circuit, and a mapping circuit. The mapping logic circuit can receive a repair address from one or more nodes of the package, in which the repair address is mapped to at least one memory cell of the memory cells determined to be defective. The mapping logic circuit can sequentially output respective digits of information indicative of the repair address responsive to activation of a post-package repair mode of the packaged memory device. The mapping circuit can receive the digits of information indicative of the repair address from the mapping logic circuit, and remap the repair address to an other address associated with a redundant portion of the memory cells.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
memory cells in a package;
a storage element configured to store information responsive to a post-package repair mode being activated, the information identifying an address to be repaired, wherein the address to be repaired is mapped to a portion of the memory cells, wherein the storage element is configured to store the information responsive to data received from nodes of the package;
a walking token circuit configured to sequentially output respective digits of the information stored in the storage element responsive to the post-package repair mode being activated; and
a mapping circuit configured to remap, responsive to receiving the digits of information from the walking token circuit, the address to be repaired to another portion of the memory cells.

2. The apparatus of claim 1, wherein the portion of the memory cells to be repaired includes a memory cell deemed defective.

3. The apparatus of claim 1, wherein the walking token circuit is configured to provide a plurality of bits and each of the digits of information represents a bit of information, wherein one bit of the plurality of bits is an active bit, wherein the walking token circuit is configured to sequentially output the digits of information responsive to a sequence of bitwise comparisons between the information identifying the address to be repaired and the plurality of bits, wherein the active bit is shifted through each of the plurality of bits over the course of the sequence of comparisons.

4. The apparatus of claim 3, further comprising a timing circuit configured to provide a clock signal, wherein the walking token circuit is configured to receive the clock signal, and wherein the walking token circuit is configured to shift the active bit of the plurality of bits responsive to the clock signal and activation of the repair mode.

5. The apparatus of claim 4, wherein the clock signal comprises a repair mode clock signal, and wherein the timing circuit is configured to frequency divide a global clock signal to provide the repair mode clock signal at a lower frequency than the global dock signal.

6. The apparatus of claim 4, wherein the clock signal comprises a first repair mode clock signal for programming the mapping circuit and a second repair mode clock signal to provide timing of a disable phase and a programming phase of the repair mode.

7. The apparatus of claim 3, wherein the walking token circuit comprises a plurality of flip flops configured to provide the plurality of bits, wherein the plurality of flip flops are operatively coupled in series such that the flip flops are configured to shift the active bit through each of the plurality of bits.

8. The apparatus of claim 1, wherein the portion of the memory cells to be repaired and the other portion of the memory cells respectively comprise first and second groups of redundant memory cells, and wherein the mapping circuit comprises an associated group of programmable elements for each of the first and second groups of redundant memory cells, wherein the mapping circuit is configured to remap the address to be repaired from the first group of redundant memory cells to the second group of redundant memory cells by disabling the first group of redundant memory cells and by programming the group of programmable elements associated with the second group of redundant memory cells.

9. The apparatus of claim 8, wherein the programmable elements comprise antifuses.

10. The apparatus of claim 8, wherein the mapping circuit is further configured to program the programmable elements sequentially responsive to the receiving the digits of information from the walking token circuit.

11. The apparatus of claim 8, further comprising a selection circuit configured to generate a selection signal, wherein the selection signal indicates the selected group of the programmable elements to be programmed.

12. The apparatus of claim 8, wherein each group of the programmable elements comprises first and second elements, wherein the first and second elements in combination are indicative of whether the associated group of redundant memory cells is enabled.

13. The apparatus of claim 12, wherein the first element is configured to store a bit of the address mapped to an associated group of redundant memory cells.

14. The apparatus of claim 12, wherein the first and second elements are configured to indicate that an associated group of redundant memory cells is enabled if the first element is in a different state than the second element, wherein the first and second elements are configured to indicate that the associated group of redundant memory cells is disabled if the first element is in a same state as the second element.

15. The apparatus of claim 8, wherein the mapping circuit is configured to disable an enabled group of redundant memory cells if the group of programmable elements associated with the enabled group of redundant memory cells is programmed with the address to be repaired.

16. The apparatus of claim 1, further comprising:
a processing resource; and
a memory device operatively coupled to the processing resource, the memory device including:
the memory cells;
the storage element;
the walking token circuit; and
the mapping circuit.

17. The apparatus of claim 1, wherein the storage element comprises a latch circuit, and wherein the mapping circuit comprises a redundant memory logic circuit.

18. The apparatus of claim 1, wherein the apparatus includes a mapping logic circuit, the mapping logic circuit including the storage element and the walking token circuit.

19. The apparatus of claim 18, wherein the mapping logic circuit further comprises a selection circuit.

20. The apparatus of claim 1, wherein the mapping circuit comprises:
a disable redundant circuit; and
a row of antifuses coupled to the disable redundant circuit; and
compare and match logic coupled to the row of antifuses and the disable redundant circuit, wherein the disable redundant circuit is configured to disable the portion of the memory cells to be repaired responsive to an indication by the compare and match logic that the row of antifuses stores an address matching the address to be repaired.

21. An electronically-implemented method for post-package repair of memory cells, the method comprising:
activating a post-package repair mode responsive to inputs received from outside of a package including memory cells;
storing information in a storage element responsive to the post-package repair mode being activated, the information identifying an address to be repaired, wherein the address to be repaired is mapped to a portion of the memory cells to be repaired, wherein the storage element is configured to store the information responsive to data received from nodes of the package;
sequentially outputting, with a walking token circuit, respective data digits of the information stored in the storage element responsive to activation of the post-package repair mode; and
responsive to receiving the respective data digits, remapping the address to be repaired to another portion of the memory cells.

22. The method of claim 21, wherein sequentially outputting the respective data digits of information comprises:
generating a plurality of bits, wherein a selected one of the plurality of bits is active; and
sequentially comparing bitwise, with the walking token circuit, the information identifying the address to be repaired and the plurality of bits, wherein the active bit is shifted through each of the plurality of bits over the course of the sequentially comparing.

23. The method of claim 22, wherein the walking token circuit is further configured to shift the active bit of the plurality of bits responsive to a clock signal and activation of the repair mode.

24. The method of claim 23, further comprising setting bits of a fuse address signal to values corresponding to values of bits of the address to be repaired sequentially responsive to a position of the active bit.

25. The method of claim 24, wherein the fuse address signal has, at most, one bit set active at each clock cycle of the clock signal.

26. The method of claim 25, wherein remapping comprises sequentially blowing antifuses of a selected row of antifuses responsive to the fuse address signal.

27. The method of claim 21, wherein remapping comprises programming the address into a group of programmable elements associated with the other portion of the memory cells.

28. The method of claim 27, wherein the portion of the memory cells to be repaired comprises a group of redundant memory cells and wherein remapping comprises disabling the group of redundant memory cells by programming a programmable element of an other group of programmable elements, wherein the other group of programmable elements is associated the group of redundant memory cells.

29. The method of claim 28, wherein the group of redundant memory cells is disabled and the address is programmed into the group of programmable elements associated with the other portion of the memory cells responsive to determining that the address to be repaired is already assigned to the group of redundant memory cells.

30. A packaged memory device comprising:
    memory cells in a package;
    a mapping logic circuit configured to receive a repair address from one or more nodes of the package, wherein the repair address is mapped to at least one memory cell of the memory cells determined to be defective, and to sequentially output respective digits of information indicative of the repair address responsive to activation of a post-package repair mode of the packaged memory device;
    a timing circuit configured to provide a repair mode clock signal to the mapping logic circuit, wherein the repair mode clock signal has a lower frequency than a global clock signal of the packaged memory device; and
    a mapping circuit configured to receive the digits of information indicative of the repair address from the mapping logic circuit, and to remap the repair address to an other address associated with a redundant portion of the memory cells.

31. The device of claim 30, wherein the mapping logic circuit comprises a storage element configured to latch the repair address.

32. A memory device comprising:
    memory cells;
    a mapping logic circuit configured to receive a repair address, wherein the repair address is mapped to at least one memory cell of the memory cells determined to be defective, and wherein the mapping logic circuit comprises a walking token circuit configured to sequentially output the respective digits of information indicative of the repair address responsive to activation of a post-package repair mode of the memory device; and
    a mapping circuit configured to receive the digits of information indicative of the repair address from the mapping logic circuit, and to remap the repair address to an other address associated with a redundant portion of the memory cells.

33. The device of claim 32, further comprising a timing circuit configured to provide a repair mode clock signal to the mapping logic circuit, wherein the repair mode clock signal has a lower frequency than a global clock signal of the packaged memory device.

34. The device of claim 30, wherein the repair address is associated with a different redundant portion of the memory cells.

35. The device of claim 30, wherein the mapping circuit comprises antifuses configured to store the repair address.

36. The device of claim 32, wherein the mapping circuit comprises a group of programmable elements associated with the redundant portion of the memory cells, wherein the mapping circuit is further configured to remap the repair address to the other address associated with the redundant portion of the memory cells by programming the group of programmable elements associated with the redundant portion of the memory cells.

37. The device of claim 36, wherein the mapping circuit further comprises a selection circuit configured to generate a selection signal, wherein the selection signal indicates a selection of the group of the programmable elements to be programmed.

38. The device of claim 32, further comprising a storage element configured to latch the repair address.

* * * * *